United States Patent [19]

Togo et al.

[11] Patent Number: 4,741,599

[45] Date of Patent: May 3, 1988

[54] DISPLAY INFORMATION EXCHANGE DEVICE FOR AN ELECTROSTATIC DISPLAY APPARATUS

[75] Inventors: Hidehiko Togo; Yoshiaki Azumi, both of Kakogawa, Japan

[73] Assignee: Daiwa Shinku Corporation, Hyogo, Japan

[21] Appl. No.: 701,949

[22] Filed: Feb. 15, 1985

[30] Foreign Application Priority Data

Feb. 17, 1984 [JP] Japan .................................. 59-29396
Feb. 17, 1984 [JP] Japan .................................. 59-29397

[51] Int. Cl.$^4$ ........................ G02B 26/02; G09G 3/34
[52] U.S. Cl. ..................................... 350/269; 340/783
[58] Field of Search ............... 350/266, 269, 270, 271; 340/783, 798, 799, 763; 339/17 LC

[56] References Cited

U.S. PATENT DOCUMENTS

| 3,973,817 | 8/1976 | Stalley et al. | .................. 339/17 LC |
| 4,370,733 | 1/1983 | Gaudio | .................. 340/799 |
| 4,468,663 | 8/1984 | Kalt | .................. 350/269 |
| 4,571,603 | 2/1986 | Hornbeck et al. | .................. 340/783 |

Primary Examiner—John K. Corbin
Assistant Examiner—Ronald M. Kachmarik
Attorney, Agent, or Firm—Koda and Androlia

[57] ABSTRACT

A device for exchanging the display information to be given to an electrostatic display apparatus constituted with many electrostatic display units arranged to form a matrix. The present device comprises a RAM and a backup battery, both mounted on a base plate detachable from the main circuit of the device. This device makes it possible to partially change the display information data without interrupting the display in proceeding.

2 Claims, 5 Drawing Sheets

FIG. 5
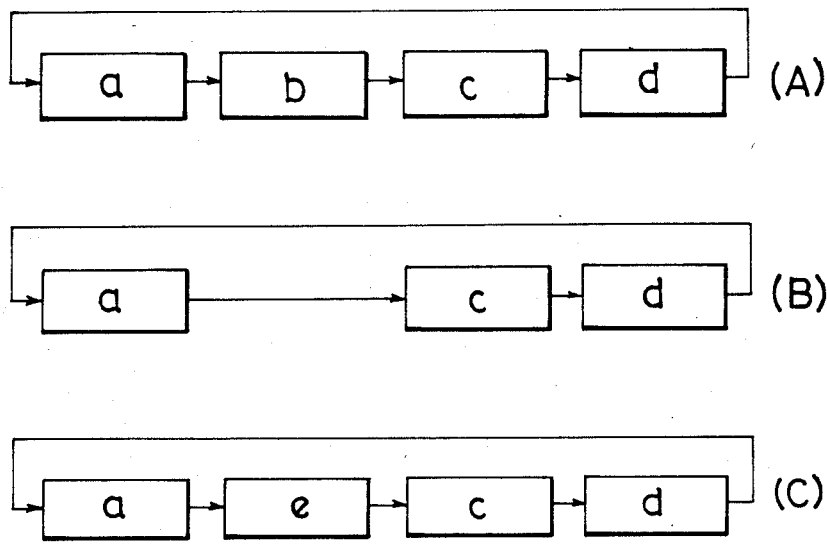
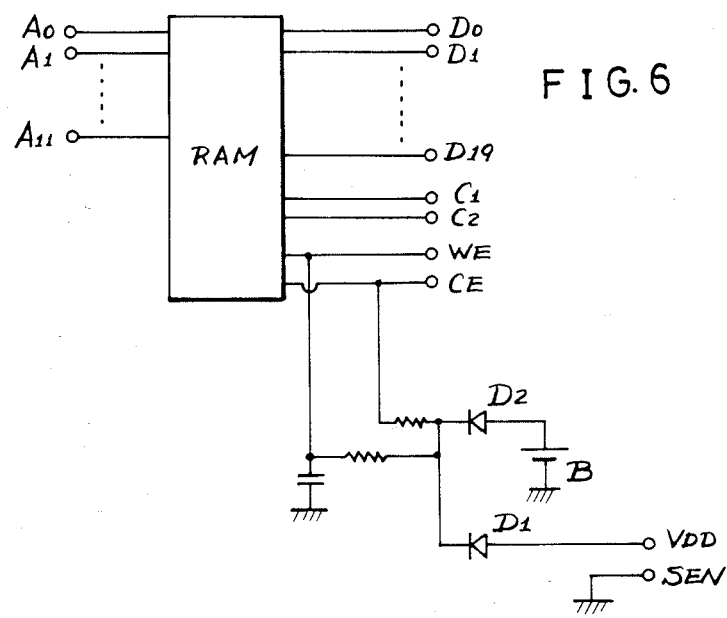
FIG. 6

DISPLAY INFORMATION EXCHANGE DEVICE FOR AN ELECTROSTATIC DISPLAY APPARATUS

BACKGROUND OF THE INVENTION

1. Field of the Invention

The present invention relates to a display information exchange device for an electrostatic display apparatus, and more particularly to a device for partially exchanging the display information of a display apparatus constituted with many electrostatic display units arranged so as to form a matrix.

2. Prior Art

In the first place the principle of an electrostatic display unit. The unit is described is basically constituted with a fixed electrode, a movable electrode and an insulating layer, which is to prevent both the electrodes from being short-circuited when, as will be mentioned below, the moving electrode gets in touch with the fixed electrode. With a high voltage supplied between both of the electrodes, a produced electrostatic force pulls and bends the movable electrode so as to cover the fixed electrode. Thus the display unit has its appearance changed by an electrostatic force.

An example of such an electrostatic display units is shown in FIG. 1. In the figure a cylindrical inner fixed electrode 2 is mounted on a base 1. On both sides of the base 1 are fixed two film holders 3, 3 by which two film-like movable electrodes 4, 4 are held extending upward with their upper portions made to form free ends 5, 5. On the outer sides of the film holders 3, 3 two outer fixed electrodes 7, 7 are mounted with spacers 6, 6 inserted. The outer fixed electrodes 7, 7 have their middle portions hemi-cylindrically extruded inward. The base 1, the film holders 3, 3, lower portions of the movable electrodes 4, 4, the spacers 6, 6 and lower portions of the outer electrodes 7, 7 are totally fixed with screw bolts 8, 8. The outer surface of the inner fixed electrode 2 and the inner surfaces of the outer fixed electrodes 7, 7 are coated with insulating paints having their respective particular colors. On the other hand the both surfaces of the movable electrodes 4, 4 are mirror-finished. Further, the inner fixed electrode 2, the filmer holders 3, 3 and the outer fixed electrodes 7, 7 have their lowermost ends fabricated so as to provide their respective terminals 2A, 4A and 7A.

In the above constitution of the display unit, if a voltage is supplied between the terminals 4A and 7A, the movable electrodes 4, 4 open outward to fully dispose the inner fixed electrode 2. Therefor, the appearance of the display unit seen from above looks in the color applied to the inner fixed electrode 2. With a voltage supplied between the terminals 4A and 2A, the movable electrodes 4, 4 are bent so as to cover the surface of the inner fixed electrode 2, and therefore the seeming color of the display unit changes to that applied to the inner surfaces of the outer fixed electrodes 7, 7.

With many such electrostatic display units arranged in the length and breadth so as to form a matrix, an electrostatic display apparatus can be constituted. FIG. 2 shows an example of the pattern dot-displayed on such a display apparatus. The display apparatus can be made to display not only a static pattern but also a moving or a flowing patterns by shifting the display information at a constant speed or varying the display information gradually.

In some cases, however, it is desired to delete some of the provided pieces of display information or to replace them with other kinds of display information.

OBJECTS AND SUMMARY OF THE INVENTION

An object of the present invention is to provide a device capable of easily exchanging part of the display information to an electrostatic display apparatus without interrupting display.

Another object of the present invention is to provide means for making it possible to stock many pieces of display information easily and safely.

For the achievement of these objects the device according to the present invention comprises a RAM for memorizing part of the display information and a battery for backing up the RAM, and has the RAM and the battery mounted on a common base plate made detachable from the main body of the device.

BRIEF DESCRIPTION OF THE DRAWINGS

The present invention is further described in detail in the following with reference to the attached drawings, in which:

FIG. 5 is a drawing illustrating the function of the above embodiment;

FIG. 6 shows a circuit of a separate RAM used in the above embodiment;

DETAILED DESCRIPTION OF THE INVENTION

Figure 1:
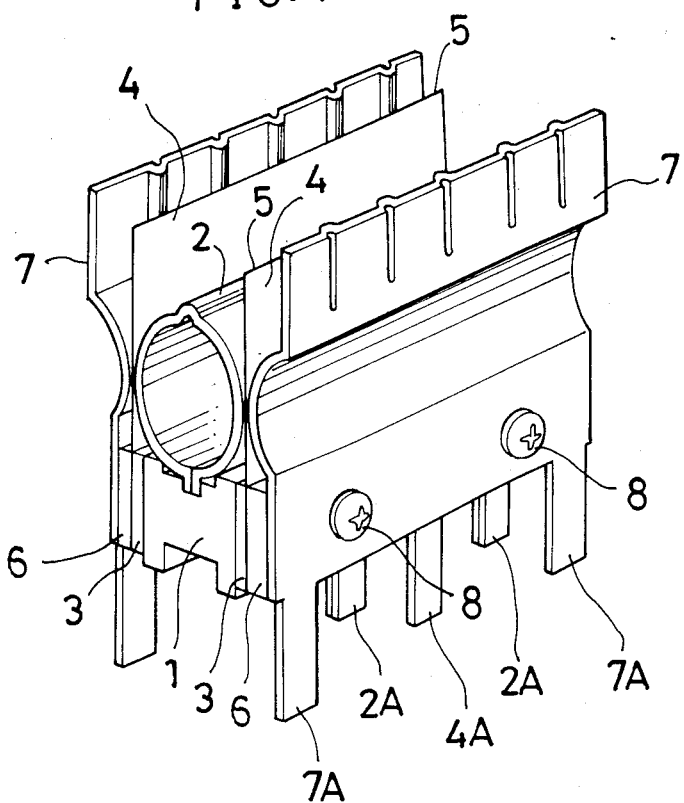
FIG. 1 shows a perspective view of an electrostatic display unit used in the present invention.
Figure 2:
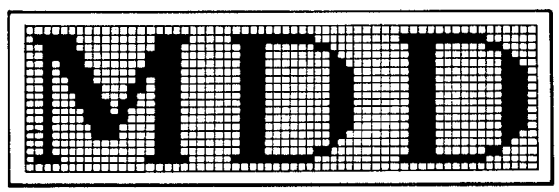
FIG. 2 shows an example of pattern display.
Figure 3:
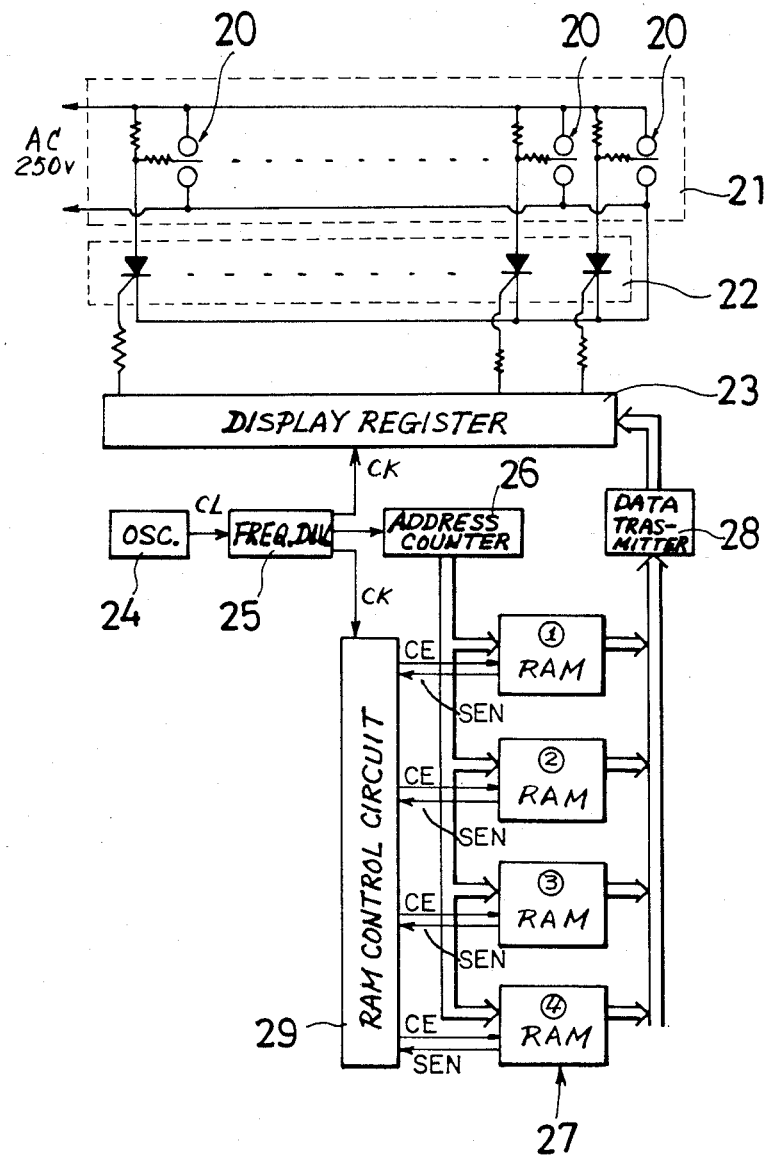
FIG. 3 shows a block diagram illustrating the constitution of an embodiment of the present invention.

In FIG. 3, which shows the constitution of an embodiment of the present invention, a display panel 21 is constituted with many electrostatic display units 20 (whose perspective view is shown in FIG. 1) arranged to form a matrix. The number of the display units is, for example, 20×200. A display unit driving circuit 22 is made up of many thyristors, each of which corresponds to each of the display units 20. A display register 23 consists of shift registers set to form a matrix in correspondence with the display units 20, and shift-driven by clock pulses CK which are made by dividing the output frequency CL from an oscillator 24 by a frequency divider 25. The dividing step varies according to display instruction codes $C_1$, $C_2$ mentioned below, so the frequency of the clock pulses CK depends on the codes. The clock pulses CK drive an address counter 26 of RAM's 27. The RAM's 27 are assembled on separate base plates according to the contents of their display information. Each of the base plates is made detachable from the main of the circuits by means of a multi-connector. The contents stored in the RAM's 27 are transmitted to the display register 23 column by column by a data transmitter 28. The contents of the separate RAM's are read out in the order of ①→②→③→④. However, if the RAM ② is put off, they are read out in the order of ①→③→④ with the part ② jumped over. The succession of reading out is controlled by a RAM control circuit 29.

Figure 4:
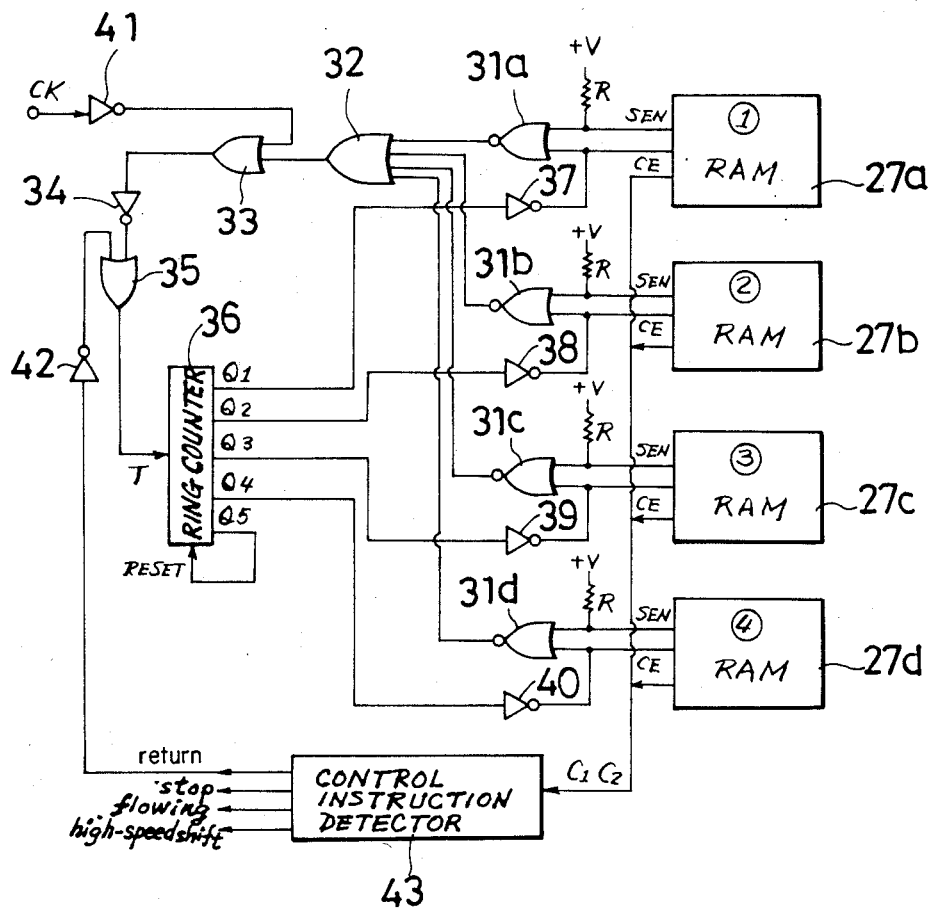
FIG. 4 shows an example of the RAM control circuit in FIG. 3.

FIG. 4 shows an embodiment of the RAM control circuit 29. Terminals SEN of the RAM's are the terminals for detecting whether the base plates of the RAM's are mounted on the main circuits. The terminals SEN themselves are grounded within the baseplate, while the outer lines connected to the terminals SEN are supplied with plus voltages +V. Therefore, terminals SEN with the corresponding RAM's mounted are kept at a low level (L), but they turn to a high level (H) with the RAM's dismounted. On the other hand, chip enable terminals CE are at L-level if the corresponding RAM's at an active state, and at H-level if the RAM's at a self-holding state. Of four RAM's, only one is at an active state. NOR gates 31a, 31b, 31c and 31d are to detect that the corresponding RAM's are mounted and at an active state. An OR gate 32 detects that all of the four NOR gates 31a to 31d output L-levels, and outputs L-level. An OR gate 33 passes the clock signal CK if the OR gate 32 outputs L-level; and blocks the clock signal CK if the OR gate 32 outputs a H-level. The output from the OR gate 33 is inputted to an OR gate 35 through an inverter 34. The OR gate 35 has the OR function for both a return signal indicating the completion of data of the RAM which was at an active state and a clock signal CK passing through the inverter 34. The return signal become a count-up signal to a ring counter 36. According to the output T from the OR gate 35, the ring counter 36 makes it output terminals at H-level successively in the order of $Q_1 \rightarrow Q_2 \rightarrow \ldots \rightarrow Q_5 \rightarrow Q_1$. The output terminals $Q_1, \ldots, Q_4$ are connected to the chipenable terminals CE of the corresponding RAM's through inverters 37, ..., 40, respectively. Control instruction codes $C_1$, $C_2$ are written in each of the RAM's together with the display data. The control instruction codes specify, as is shown in the table below, the flowing display mode, the high-speed shift mode, the stop mode and the return mode. The return mode is written just after the last data in the separate RAM's. In FIG. 4, reference numbers 41 and 42 indicate inverters.

| $C_1$ | $C_2$ | Mode |
| --- | --- | --- |
| 0 | 0 | Flowing display |
| 1 | 0 | High-speed shift |
| 0 | 1 | Stop |
| 1 | 1 | Return |

The function of the above embodiment is described in the following.

Now suppose that the first RAM 27a is at an active state. As the output of the first NOR gate 31a is at H-level, the OR gates 32 and 33 output H-levels, so the clock pulse CK is masked and can not be detected. In this case the inverter 34 at L-level, so the OR gate 35 is ready to detect the return signal of a control instruction. On the ending of the last data of the first RAM 27a, a control instruction detector 43 detects the return code and outputs the return signal. Accordingly the ring counter 36 makes the chip enable terminal CE of the second RAM 27b L-level, and at the same time it makes the terminal CE of the first RAM 27a return to H-level. Therefore, if the second RAM 27b has been mounted at this stage, the second NOR gate 31b outputs H-level, so the OR gate 35 again becomes ready to detect the return signal. In such a manner the RAM's 27a, 27b, 27c and 27d are, if all mounted, put into an active state successively in the order of a→b→c→d→a→..., as shown in FIG. 5(A), and the information in the RAM's is read out.

However, if the second RAM 27b is put off, the NOR gate 31b outputs L-level irrespective of the level of the chip enable terminal CE, because the mounting detection terminals CE turns to H-level. The return signal from the first RAM 27a is detected, and the ring counter 36 outputs $Q_2$. Then all the four NOR gate 31a to 31d output L-level, so the output of OR gate 32 also turns to L-level and the OR gate 33 becomes ready to detect the clock signals CK. The clock signals are continually outputted, so the output of the ring counter 36 proceeds from $Q_2$ to $Q_3$. If the third RAM 37c has been mounted at this stage, the output of the OR gate 33 is again kept at H-level to mask the clock signal CK, and the OR gate 35 become ready to detect the return instruction from the third RAM 27c. The address of the RAM not mounted to the connector is thus jumped over. FIG. 5(B) shows the order of reading out the data when only the second RAM 27b is put off. Further, in case the fifth RAM e (a RAM other than those shown in FIG. 4) is inserted in the connector for the second RAM, that is, the second RAM is replaced with the fifth RAM e, the data are read out in the order of a→e→c→d→a→..., as shown in FIG. 5(C). As the FIG. 5(C) shows, the display data can be partially changed only by replacing a RAM.

FIG. 6 shows a circuit constitution on the base plate detachable from the main circuit. The RAM has address specifying terminals $A_0, \ldots, A_{11}$, display data output terminals $D_0, \ldots, D_{19}$, control instruction code terminals $C_1$, $C_2$, a writenable terminal WE and a chip enable terminal CE. In addition to these terminals, the base plate is further provided with a D.C. power source terminal VDD and a mounting detection terminal SEN. The RAM is externally power-supplied from the D.C. power source terminal VDD through a diode $D_1$. In addition a back-up power is supplied from a back-up B on the base plate through a diode $D_2$. The diode $D_2$ is made conducting with the base plate put off from the connector, because the external voltage VDD is cut off. With the base plate connected to the connecter, only the external voltage is supplied with the diode $D_2$ made non-conducting, because the voltage of the battery B is lower than the external voltage VDD.

Figure 7:
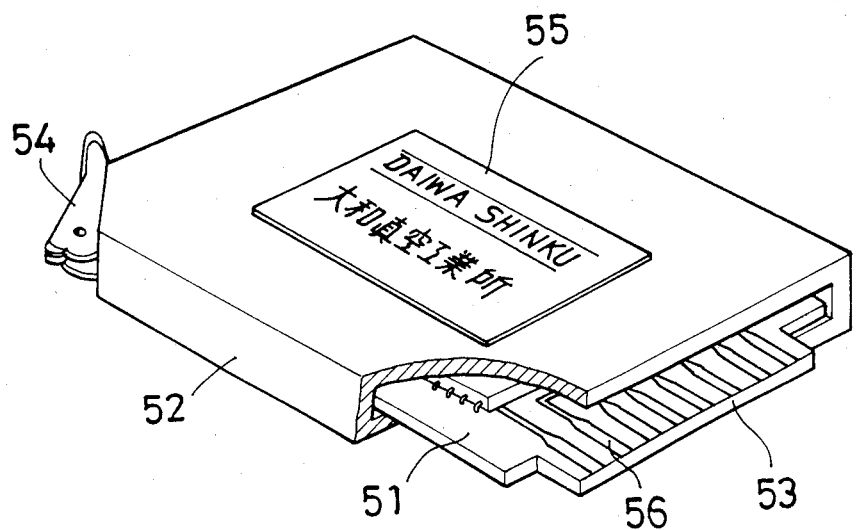
FIG. 7 shows a perspective outer view of the above separate RAM.

FIG. 7 shows a partially cut-out perspective view of a package 52 containing a base plate 51. The base plate 52, which is protected by the package 51, has its terminals 53, 56 inserted to a multi-connector. A lever 54 attached to the package 52 is used for disconnecting the base plate. On the outer surface of the package, a name plate 55 can be applied to indicate the title, the pattern to be displayed and others.

Figure 8:
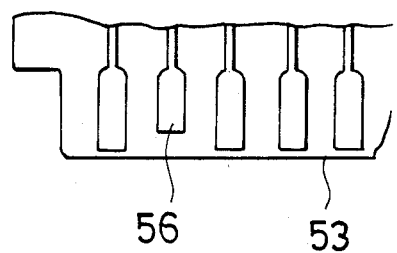
FIG. 8 shows a shorter terminal corresponding to the chip enable terminal of the RAM.

In the present embodiment, it is an important feature that, as is shown in FIG. 8, only the chip enable terminal 56 is made shorter than other terminals. This causes the chip enable terminal 56 to be disconnected prior to other terminals when the base plate is detached from the multi-connector. Thus the RAM is self-held. When the base plate is inserted to the multi-connector, the chip enable terminal 56 is connected posterior to other terminals, and the self-holding is released after the power source connection. Therefore, the contents of the RAM can be protected from being damaged by noises, even if the base plate is detached without cutting off the power source.

What is claimed is:

1. A display information exchange device for an electrostatic display apparatus, said device being for exchanging the display information of an electrostatic display apparatus constituted with a plurality of electrostatic display units arranged in the form of a matrix, each of said electrostatic display units consisting of a fixed electrode, an elastic movable electrode held in the vicinity of said fixed electrode, a dielectric layer provided on the surface of either or both of said fixed electrode and said movable electrode, and lead wires for supplying voltage between said fixed electrode and said movable electrode, whereby each of said electrostatic display units is made to have its appearance changed with said voltage supplied because said movable electrode is electrostatically attracted so as to cover the surface of said fixed electrodes, said device comprising:
- a display unit driving circuit consisting of a plurality of switching elements each of which switches the voltages to be supplied to each of said electrostatic display units;
- a display register consisting of a plurality of shift registers whose output signals control said electrostatic display units by directly operating said switching elements constituting said display unit driving circuit;
- a RAM or RAMs separately provided with their respective back-up batteries and separately mounted on their respective separate circuit boards devised so as to be detachably connected to the main circuit portion of said device, said RAM or RAMs storing signals for controlling said display register and display mode instruction code signals; and
- a RAM control circuit for controlling said RAM or RAMs according to externally inputted clock signals and said display mode instruction code signals.

2. A device as defined in claim 1, wherein the terminals provided on said circuit boards in correspondance with chip enable terminals of said RAM or RAMs are made shorter than the other terminals provided on said circuit boards in correspondence with the terminals other than said chip enable terminals of said RAM or RAMs.

* * * * *